United States Patent
Shiah et al.

(10) Patent No.: US 8,854,911 B2
(45) Date of Patent: Oct. 7, 2014

(54) MEMORY AND METHOD OF REFRESHING A MEMORY

(71) Applicant: Etron Technology, Inc., Hsinchu (TW)

(72) Inventors: Chun Shiah, Hsinchu (TW); Sen-Fu Hong, Tainan (TW)

(73) Assignee: Etron Technology, Inc., Hsinchu (TW)

( * ) Notice: Subject to any disclaimer, the term of this patent is extended or adjusted under 35 U.S.C. 154(b) by 24 days.

(21) Appl. No.: 13/743,350

(22) Filed: Jan. 17, 2013

(65) Prior Publication Data
US 2013/0250711 A1 Sep. 26, 2013

(30) Foreign Application Priority Data
Mar. 26, 2012 (TW) .............................. 101110342 A

(51) Int. Cl.
G11C 7/00 (2006.01)
G11C 11/402 (2006.01)
G11C 11/406 (2006.01)

(52) U.S. Cl.
CPC ........ *G11C 11/402* (2013.01); *G11C 11/40615* (2013.01); *G11C 11/40603* (2013.01); *G11C 11/40618* (2013.01)
USPC ...................................... 365/222; 365/230.05

(58) Field of Classification Search
CPC ................................ G11C 11/406; G11C 8/16
USPC ............................................ 365/222, 230.05
See application file for complete search history.

(56) References Cited

U.S. PATENT DOCUMENTS

| | | | |
|---|---|---|---|
| 2005/0169091 A1* | 8/2005 | Miki et al. | 365/230.03 |
| 2007/0083701 A1* | 4/2007 | Kapil | 711/106 |
| 2007/0171750 A1* | 7/2007 | Oh | 365/222 |
| 2009/0019242 A1* | 1/2009 | Kobaysashi | 711/156 |
| 2009/0091997 A1* | 4/2009 | Miki et al. | 365/222 |
| 2011/0194358 A1* | 8/2011 | Choi | 365/189.02 |

* cited by examiner

*Primary Examiner* — Michael Tran
(74) *Attorney, Agent, or Firm* — Winston Hsu; Scott Margo

(57) ABSTRACT

A memory includes a determination circuit, a plurality of refresh counters, and a plurality of banks. The determination circuit receives a refresh command. The plurality of refresh counters are coupled to the determination circuit. Each refresh counter of the plurality of refresh counters corresponds to one bank of the plurality of banks. The determination circuit detects whether a first bank of the plurality of banks is enabled or a number counted by a first refresh counter of the plurality of refresh counters corresponding to the first bank is equal to a predetermined value. Then, the determination circuit optionally refreshes one bank of the plurality of banks according to a detection result. Thus, the memory still refreshes an idle bank according to a refresh command even if the plurality of banks are not all idle.

19 Claims, 5 Drawing Sheets

MEMORY AND METHOD OF REFRESHING A MEMORY

BACKGROUND OF THE INVENTION

1. Field of the Invention

The present invention relates to a memory and a method of refreshing a memory, and particularly to a memory and a method of refreshing a memory that can refresh one disabled bank of at least one disabled bank according to a refresh command as long as at least one bank is disabled.

2. Description of the Prior Art

In the prior art, as long as at least one bank of a Dynamic Random Access Memory (DRAM) is enabled, a controller of the DRAM can not transmit a refresh command to the DRAM. Please refer to FIG. 1. FIG. 1 is a diagram illustrating refreshing a memory according to the prior art. As shown in FIG. 1, when the controller continues to transmit read commands R0 and write commands W0 to a bank of the DRAM, the controller can not transmit any refresh command to the DRAM. Therefore, sometimes the controller does not transmit any refresh command to the DRAM for a very long time, resulting in the DRAM not being refreshed for a very long time.

In the prior art, only when all banks of the DRAM are in an idle state does the controller transmit a refresh command to the DRAM, so refresh efficiency of all banks of the DRAM is not high enough.

SUMMARY OF THE INVENTION

An embodiment provides a method of refreshing a memory. The method includes receiving a refresh command; detecting whether a first bank of a plurality of banks is enabled or a number counted by a first refresh counter corresponding to the first bank is equal to a predetermined value to generate a first detection result; and executing a first corresponding operation according to the first detection result.

Another embodiment provides a memory. The memory includes a determination circuit, a plurality of refresh counters, and a plurality of banks. The determination circuit is used for receiving a refresh command. The plurality of refresh counters is coupled to the determination circuit. The plurality of banks is coupled to the plurality of refresh counters, where each refresh counter of the plurality of refresh counters corresponds to one bank of the plurality of banks. The determination circuit further detects whether a first bank of the plurality of banks is enabled or a number counted by a first refresh counter of the plurality of refresh counters corresponding to the first bank is equal to a predetermined value to generate a detection result. The determination circuit optionally refreshes one bank of the plurality of banks according to the refresh command according to the detection result.

The present invention provides a memory and a method of refreshing a memory. The memory and the method utilize a determination circuit to detect enabled banks of a plurality of banks or refresh counters (having counted numbers equal to a predetermined value) of a plurality of refresh counters in turn, and to transmit a refresh command to one disabled bank (a number counted by a corresponding refresh counter thereof is still smaller than the predetermined value) of at least one disabled bank. Compared to the prior art, even if the plurality of banks are not all in an idle state, the memory can still receive the refresh command to refresh an idle bank, so not only is refresh efficiency of the all plurality of banks of the memory increased, but usage efficiency of the memory is also increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
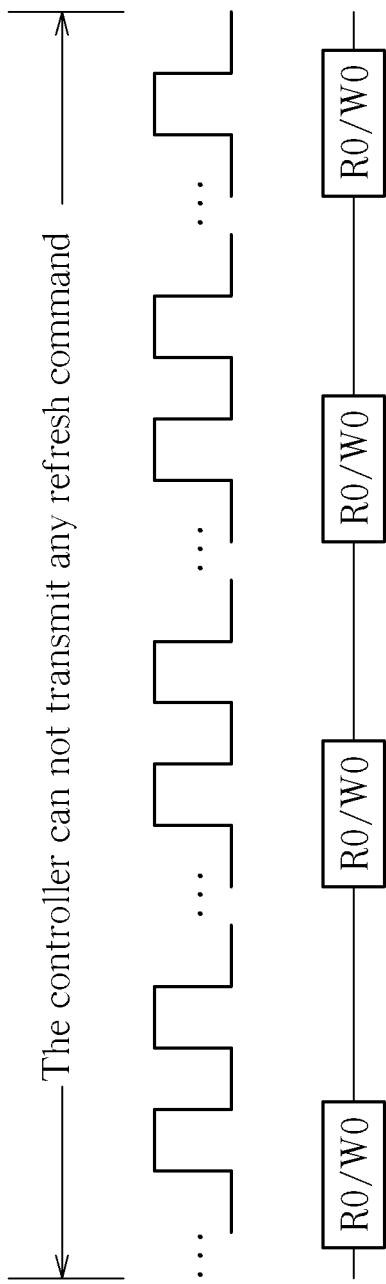
FIG. 1 is a diagram illustrating refreshing a memory according to the prior art.
Figure 2:
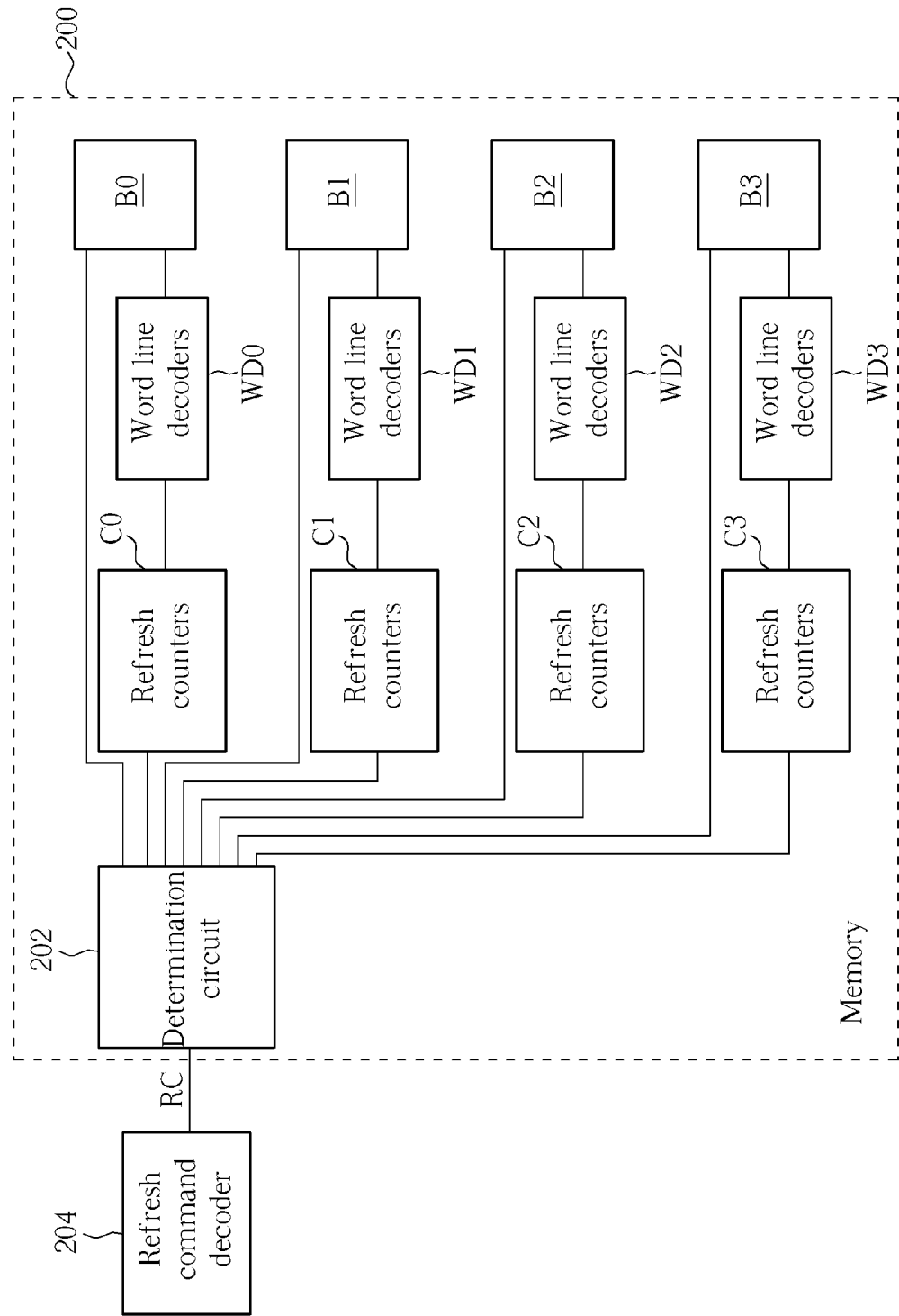
FIG. 2 is a diagram illustrating a memory according to an embodiment.

Please refer to FIG. 2. FIG. 2 is a diagram illustrating a memory 200 according to an embodiment. The memory 200 includes a determination circuit 202, 4 refresh counters C0-C3, 4 word line decoders WD0-WD3, and 4 banks B0-B3, where the 4 banks B0-B3 are the same banks or different banks. But, the present invention is not limited to the memory 200 only including the 4 banks B0-B3. That is to say, the memory 200 can include more than one bank. In addition, the memory 200 can be a Dynamic Random Access Memory (DRAM). The determination circuit 202 is used for receiving a refresh command RC, where the refresh command RC is generated by a refresh command decoder 204. The 4 refresh counters C0-C3 are coupled to the determination circuit 202. The 4 banks B0-B3 are coupled to the 4 word line decoders WD0-WD3 respectively and the determination circuit 202. As shown in FIG. 2, each refresh counter of the 4 refresh counters C0-C3 corresponds to one bank of the 4 banks B0-B3, and each word line decoder of the 4 word line decoders WD0-WD3 also corresponds to one bank of the 4 banks B0-B3. The determination circuit 202 further detects whether a first bank B0 of the 4 banks B0-B3 is enabled or a number counted by a first refresh counter C0 of the 4 refresh counters C0-C3 corresponding to the first bank B0 is equal to a predetermined value. The predetermined value corresponds to number of word lines within the first bank B0. When the first bank B0 is disabled and the number counted by the first refresh counter C0 is still smaller than the predetermined value, the determination circuit 202 can transmit the refresh command RC to the first bank B0, and a first word line decoder WD0 corresponding to the first bank B0 can decode a word line (such as an $N^{th}$ word line of the first bank B0, where N is a positive integer) corresponding to the number counted by the first refresh counter C0 according to the number counted by the first refresh counter C0. Therefore, a plurality of memory cells corresponding to the $N^{th}$ word line of the first bank B0 can be refreshed according to the refresh command RC. Meanwhile, the number counted by the first refresh counter C0 can be incremented by one.

When the first bank B0 is enabled or the number counted by the first refresh counter C0 is equal to the predetermined value, the determination circuit 202 detects whether a second bank B1 of the 4 banks B0-B3 is enabled or a number counted by a second refresh counter C1 corresponding to the second bank B1 is equal to the predetermined value. When the second bank B1 is disabled and the number counted by the second refresh counter C1 is still smaller than the predetermined value, the determination circuit 202 can transmit the refresh command RC to the second bank B1, and a second word line decoder WD1 corresponding to the second bank B1 can decode a word line (such as an $M^{th}$ word line of the second bank B1, where M is a positive integer) corresponding to the number counted by the second refresh counter C1 according to the number counted by the second refresh counter C1. Therefore, a plurality of memory cells corresponding to the $M^{th}$ word line of the second bank B1 can be refreshed according to the refresh command RC. Meanwhile, the number counted by the second refresh counter C1 can be incremented by one. In addition, when the second bank B1 is enabled or the number counted by the second refresh counter C1 is equal to the predetermined value, the determination circuit 202 detects whether a third bank B2 of the 4 banks B0-B3 is enabled or a number counted by a third refresh counter C2 corresponding to the third bank B2 is equal to the predetermined value.

When the third bank B2 is disabled and the number counted by the third refresh counter C2 is still smaller than the predetermined value, the determination circuit 202 can transmit the refresh command RC to the third bank B2, and a third word line decoder WD2 corresponding to the third bank B2 can decode a word line (such as an $L^{th}$ word line of the third bank B2, where L is a positive integer) corresponding to the number counted by the third refresh counter C2 according to the number counted by the third refresh counter C2. Therefore, a plurality of memory cells corresponding to the $L^{th}$ word line of the third bank B2 can be refreshed according to the refresh command RC. Meanwhile, the number counted by the third refresh counter C2 can be incremented by one. In addition, when the third bank B2 is enabled or the number counted by the third refresh counter C2 is equal to the predetermined value, the determination circuit 202 detects whether a fourth bank B3 of the 4 banks B0-B3 is enabled or a number counted by a fourth refresh counter C3 corresponding to the fourth bank B3 is equal to the predetermined value.

When the fourth bank B3 is disabled and the number counted by the fourth refresh counter C3 is still smaller than the predetermined value, the determination circuit 202 can transmit the refresh command RC to the fourth bank B3, and a fourth word line decoder WD3 corresponding to the fourth bank B3 can decode a word line (such as a $K^{th}$ word line of the fourth bank B3, where K is a positive integer) corresponding to the number counted by the fourth refresh counter C3 according to the number counted by the fourth refresh counter C3. Therefore, a plurality of memory cells corresponding to the $K^{th}$ word line of the fourth bank B3 can be refreshed according to the refresh command RC. Meanwhile, the number counted by the fourth refresh counter C3 can be incremented by one.

In addition, when a number counted by each refresh counter of the 4 refresh counters C0-C3 is equal to the predetermined value, the number counted by each refresh counter of the 4 refresh counters C0-C3 is reset. In addition, when each bank of the 4 banks B0-B3 is enabled, the refresh command decoder 204 does not generate the refresh command RC to the memory 200. In addition, in another embodiment of the present invention, the memory 200 further includes the refresh command decoder 204.

Figure 3:
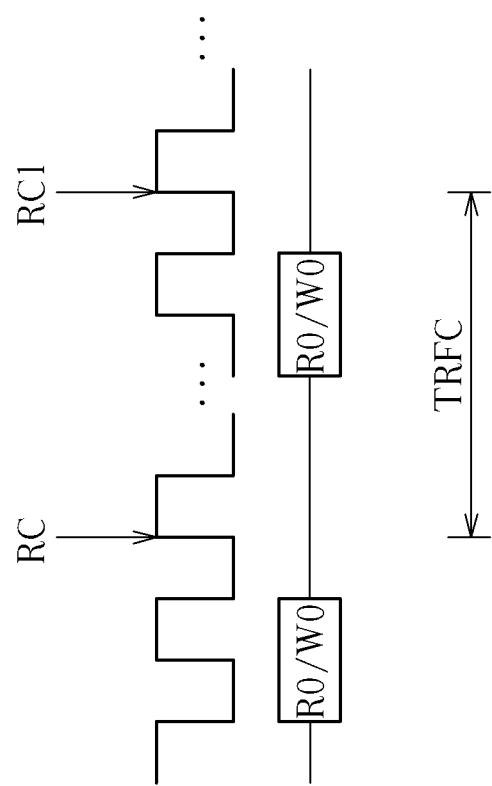
FIG. 3 is a diagram illustrating at least one predetermined period existing between the refresh command and a next refresh command followed the refresh command.

Please refer to FIG. 3. FIG. 3 is a diagram illustrating at least one predetermined period TRFC existing between the refresh command RC and a next refresh command RC1 following the refresh command RC. As shown in FIG. 3, compared to the prior art, although the present invention can increase refresh efficiency of the memory 200, a period between the refresh command RC and the next refresh command RC1 is still not smaller than the predetermined period TRFC. That is to say, the period between the refresh command RC and the next refresh command RC1 still needs to match a specification of the Dynamic Random Access Memory. As shown in FIG. 3, when the first bank B0 is enabled (such as the first bank B0 receives a read command R0/a write command W0), the refresh command decoder 204 can generate the refresh command RC to the memory 200, where the refresh command RC is used for refreshing the second bank B1, the third bank B2, or the fourth bank B3 of the memory 200.

Figure 4A:
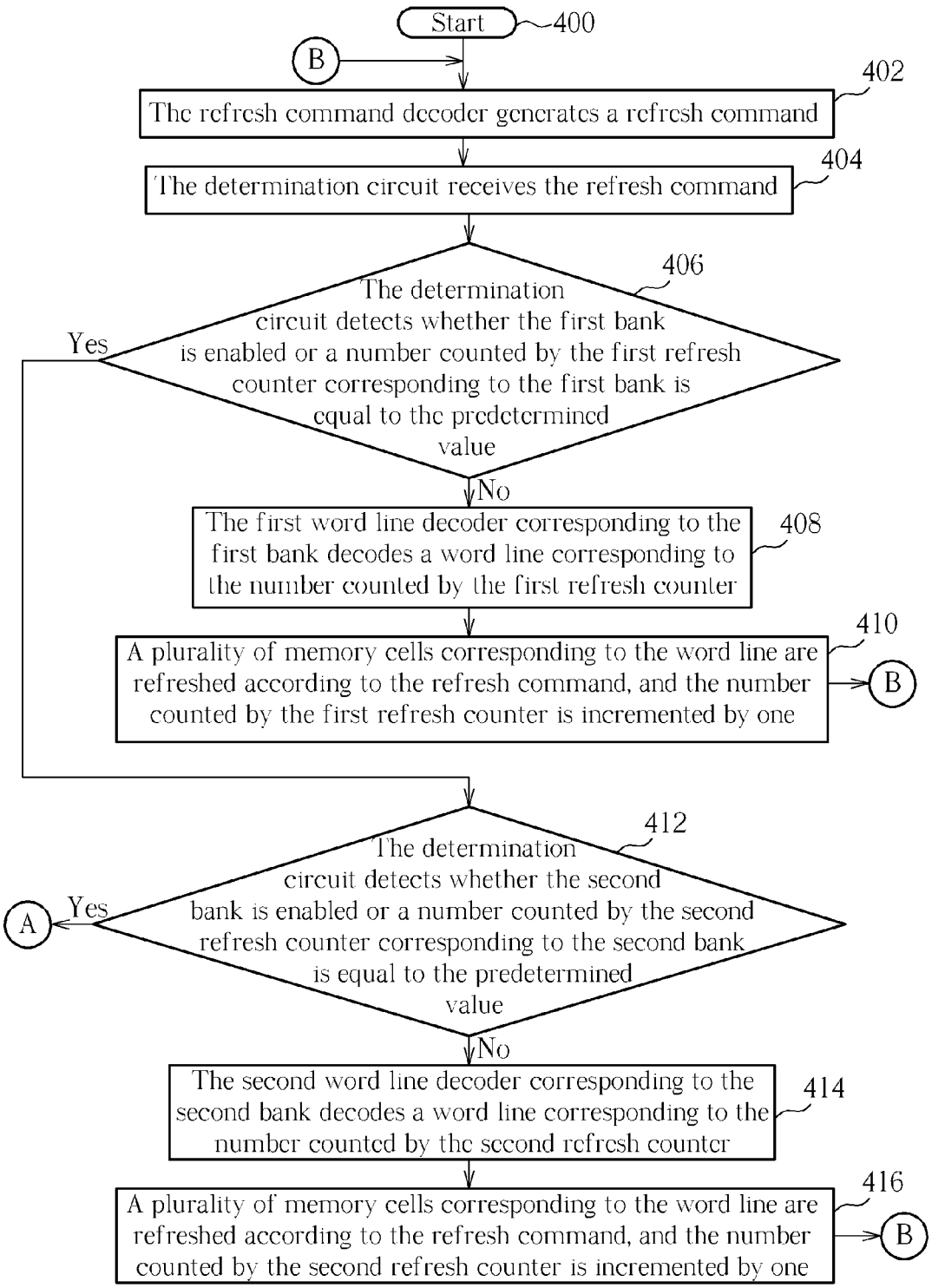
FIG. 4A and FIG. 4B are flowcharts illustrating a method of refreshing a memory according to another embodiment.
Figure 4B:
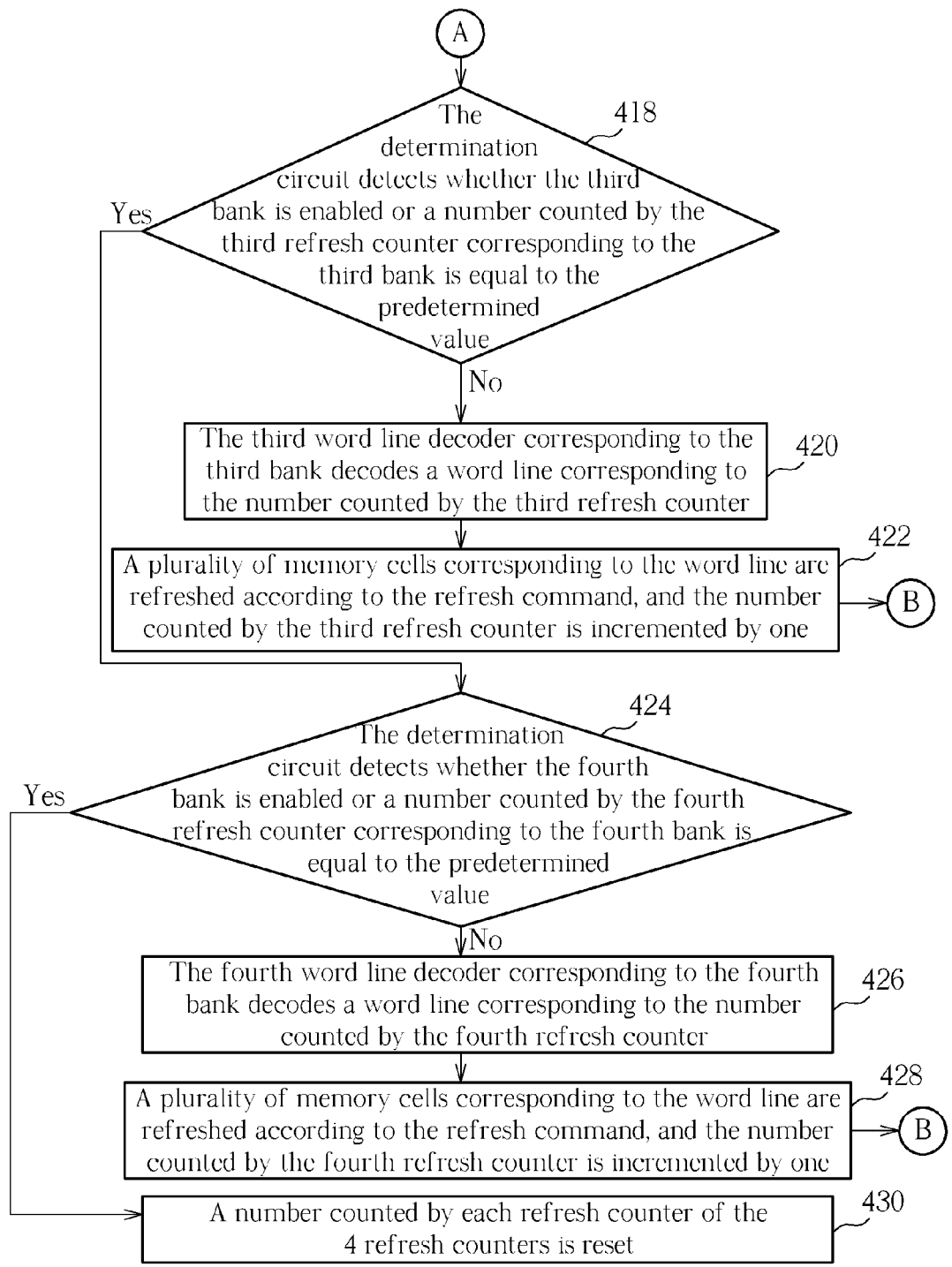

Please refer to FIG. 2, FIG. 3, FIG. 4A, and FIG. 4B. FIG. 4A and FIG. 4B are flowcharts illustrating a method of refreshing a memory according to another embodiment. The methods of refreshing a memory in FIG. 4A and FIG. 4B are illustrated using the memory 200 in FIG. 2. Detailed steps are as follows:

Step 400: Start.

Step 402: The refresh command decoder 204 generates a refresh command RC; go to Step 404.

Step 404: The determination circuit 202 receives the refresh command RC; go to Step 406.

Step 406: The determination circuit 202 detects whether the first bank B0 is enabled or a number counted by the first refresh counter C0 corresponding to the first bank B0 is equal to the predetermined value; if no, go to Step 408; if yes, go to Step 412.

Step 408: The first word line decoder WD0 corresponding to the first bank B0 decodes a word line corresponding to the number counted by the first refresh counter C0; go to Step 410.

Step 410: A plurality of memory cells corresponding to the word line are refreshed according to the refresh command RC, and the number counted by the first refresh counter C0 is incremented by one; go to Step 402.

Step 412: The determination circuit 202 detects whether the second bank B1 is enabled or a number counted by the second refresh counter C1 corresponding to the second bank B1 is equal to the predetermined value; if no, go to Step 414; if yes, go to Step 418.

Step 414: The second word line decoder WD1 corresponding to the second bank B1 decodes a word line corresponding to the number counted by the second refresh counter C1; go to Step 416.

Step 416: A plurality of memory cells corresponding to the word line are refreshed according to the refresh command RC, and the number counted by the second refresh counter C1 is incremented by one; go to Step 402.

Step 418: The determination circuit 202 detects whether the third bank B2 is enabled or a number counted by the third refresh counter C2 corresponding to the third bank B2 is equal to the predetermined value; if no, go to Step 420; if yes, go to Step 424.

Step 420: The third word line decoder WD2 corresponding to the third bank B2 decodes a word line corresponding to the number counted by the third refresh counter C2; go to Step 422.

Step 422: A plurality of memory cells corresponding to the word line are refreshed according to the refresh command RC, and the number counted by the third refresh counter C2 is incremented by one; go to Step 402.

Step 424: The determination circuit 202 detects whether the fourth bank B3 is enabled or a number counted by the fourth refresh counter C3 corresponding to the fourth bank B3 is equal to the predetermined value; if no, go to Step 426; if yes, go to Step 430.

Step 426: The fourth word line decoder WD3 corresponding to the fourth bank B3 decodes a word line corresponding to the number counted by the fourth refresh counter C3; go to Step 428.

Step 428: A plurality of memory cells corresponding to the word line are refreshed according to the refresh command RC, and the number counted by the fourth refresh counter C3 is incremented by one; go to Step 402.

Step 430: A number counted by each refresh counter of the 4 refresh counters C0-C3 is reset; go to Step 402.

In Step 406, the predetermined value corresponds to number of word lines within the first bank B0. In Step 408, the first word line decoder WDO corresponding to the first bank B0 can decode the word line (such as an $N^{th}$ word line of the first bank B0) corresponding to the number counted by the first refresh counter C0 according to the number counted by the first refresh counter C0. Therefore, in Step 410, a plurality of memory cells corresponding to the $N^{th}$ word line can be refreshed according to the refresh command RC. After Step 410 is executed (go to Step 402), the refresh command decoder 204 generates a next refresh command, where a period between the refresh command RC and the next refresh command is still not smaller than the predetermined period TRFC (as shown in FIG. 3). That is to say, the period between the refresh command RC and the next refresh command still needs to match the specification of the Dynamic Random Access Memory. In addition, operational principles of the second bank B1, the third bank B2, and the fourth bank B3 are the same as those of the first bank B0, so further description thereof is omitted for simplicity. In Step 430, when a number counted by each refresh counter of the 4 refresh counters C0-C3 is equal to the predetermined value, a number counted by each refresh counter of the 4 refresh counters C0-C3 is reset. In addition, when each bank of the 4 banks B0-B3 is enabled, the refresh command decoder 204 does not generate the refresh command RC to the memory 200.

To sum up, the memory and the method of refreshing a memory utilize the determination circuit to detect enabled banks of the 4 banks or refresh counters (having counted numbers equal to the predetermined value) of the 4 refresh counters in turn, and to transmit a refresh command to one disabled bank (a number counted by a corresponding refresh counter thereof is still smaller than the predetermined value) of at least one disabled bank. Compared to the prior art, even if the 4 banks are not all in an idle state, the memory can still receive the refresh command to refresh an idle bank, so not only is refresh efficiency of the 4 banks of the memory increased, but usage efficiency of the memory is also increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of refreshing a memory, the method comprising:
   receiving a refresh command;
   detecting whether a first bank of a plurality of banks is enabled or a number counted by a first refresh counter corresponding to the first bank is equal to a predetermined value to generate a first detection result, wherein the predetermined value corresponds to a number of word lines within the first bank and the number counted by the first refresh counter is equal to a number of word lines corresponding to a plurality of refreshed memory cells of the first bank; and
   executing a first corresponding operation according to the first detection result.

2. The method of claim 1, wherein executing the first corresponding operation according to the first detection result comprises:
   refreshing the first bank according to the refresh command when the first bank is disabled and the number counted by the first refresh counter is smaller than the predetermined value.

3. The method of claim 2, further comprising:
   receiving a next refresh command, wherein at least one predetermined period exists between the refresh command and the next refresh command.

4. The method of claim 2, wherein the first bank being refreshed according to the refresh command comprises:
   utilizing a first word line decoder corresponding to the first bank to decode a word line corresponding to the number counted by the first refresh counter; and
   refreshing a plurality of memory cells corresponding to the word line according to the refresh command, and adding one to the number counted by the first refresh counter.

5. The method of claim 1, wherein executing the first corresponding operation according to the first detection result comprises:
   detecting whether a second bank of the plurality of banks is enabled or a number counted by a second refresh counter corresponding to the second bank is equal to the predetermined value to generate a second detection result when the first bank is enabled or the number counted by the first refresh counter is equal to the predetermined value; and
   executing a second corresponding operation according to the second detection result.

6. The method of claim 5, wherein executing the second corresponding operation according to the second detection result comprises:
   refreshing the second bank according to the refresh command when the second bank is disabled and the number counted by the second refresh counter is smaller than the predetermined value.

7. The method of claim 6, further comprising:
   receiving a next refresh command, wherein at least one predetermined period exists between the refresh command and the next refresh command.

8. The method of claim 5, wherein executing the second corresponding operation according to the second detection result comprises:
   detecting whether a third bank of the plurality of banks is enabled or a number counted by a third refresh counter of the plurality of refresh counters corresponding to the third bank is equal to the predetermined value to generate a third detection result when the second bank is enabled or the number counted by the second refresh counter is equal to the predetermined value; and
   executing a third corresponding operation according to the third detection result.

9. The method of claim 1, further comprising:
   resetting each refresh counter corresponding to the plurality of banks when a number counted by each refresh counter corresponding to the plurality of banks is equal to the predetermined value.

10. The method of claim 1, further comprising:
    a refresh command decoder generating the refresh command.

11. A memory, comprising:
    a determination circuit for receiving a refresh command;

a plurality of refresh counters coupled to the determination circuit; and a plurality of banks coupled to the plurality of refresh counters, wherein each refresh counter of the plurality of refresh counters corresponds to one bank of the plurality of banks;

wherein the determination circuit further detects whether a first bank of the plurality of banks is enabled or a number counted by a first refresh counter of the plurality of refresh counters corresponding to the first bank is equal to a predetermined value to generate a detection result, and optionally refreshes one bank of the plurality of banks according to the refresh command according to the detection result.

12. The memory of claim 11, wherein the first bank is refreshed according to the refresh command when the first bank is disabled and the number counted by the first refresh counter is smaller than the predetermined value.

13. The memory of claim 12, wherein the number counted by the first refresh counter is increased by one when the first bank is refreshed according to the refresh command.

14. The memory of claim 12, further comprising:

a plurality of word line decoders coupled to the plurality of refresh counters and the plurality of banks, wherein each word line decoder of the plurality of word line decoders corresponds to one refresh counter of the plurality of refresh counters and one bank of the plurality of banks, each word line decoder of the plurality of word line decoders is used for decoding a word line corresponding to a number countered by a corresponding refresh counter, and a plurality of memory cells corresponding to the word line are refreshed according to the refresh command.

15. The memory of claim 11, wherein the determination circuit detects whether a second bank of the plurality of banks is enabled or a number counted by a second refresh counter of the plurality of refresh counters corresponding to the second bank is equal to the predetermined value when the first bank is enabled or the number counted by the first refresh counter is equal to the predetermined value.

16. The memory of claim 11, further comprising:

a refresh command decoder for generating the refresh command.

17. The memory of claim 11, wherein the determination circuit further resets each refresh counter corresponding to the plurality of banks when a number counted by each refresh counter corresponding to the plurality of banks is equal to the predetermined value.

18. A method of refreshing a memory, the method comprising:

receiving a refresh command;

detecting whether a first bank of a plurality of banks is enabled or a number counted by a first refresh counter corresponding to the first bank is equal to a predetermined value to generate a first detection result; and refreshing the first bank according to the refresh command when the first bank is disabled and the number counted by the first refresh counter is smaller than the predetermined value.

19. A method of refreshing a memory, the method comprising:

receiving a refresh command;

detecting whether a first bank of a plurality of banks is enabled or a number counted by a first refresh counter corresponding to the first bank is equal to a predetermined value to generate a first detection result;

detecting whether a second bank of the plurality of banks is enabled or a number counted by a second refresh counter corresponding to the second bank is equal to the predetermined value to generate a second detection result when the first bank is enabled or the number counted by the first refresh counter is equal to the predetermined value; and executing a second corresponding operation according to the second detection result.

\* \* \* \* \*